US012596865B2

(12) United States Patent
Alam et al.

(10) Patent No.: US 12,596,865 B2
(45) Date of Patent: Apr. 7, 2026

(54) BUILD FLOW FOR IMPLEMENTING ARTIFICIAL INTELLIGENCE APPLICATIONS IN PROGRAMMABLE INTEGRATED CIRCUITS

(71) Applicant: Xilinx, Inc., San Jose, CA (US)

(72) Inventors: Mohammed Bader Alam, San Jose, CA (US); Goutham Pocklassery, Longmont, CO (US); Ravishankar Menon, Bengaluru (IN); Sumit Nagpal, Hyderabad (IN); Mahesh Suresh Mahadurkar, Wani (IN); Padmini Gopalakrishnan, Hyderabad (IN)

(73) Assignee: Xilinx, Inc., San Jose, CA (US)

( * ) Notice: Subject to any disclaimer, the term of this patent is extended or adjusted under 35 U.S.C. 154(b) by 689 days.

(21) Appl. No.: 18/145,704

(22) Filed: Dec. 22, 2022

(65) Prior Publication Data

US 2024/0211675 A1     Jun. 27, 2024

(51) Int. Cl.
*G06F 30/394* (2020.01)
*G06F 30/392* (2020.01)

(52) U.S. Cl.
CPC .......... *G06F 30/394* (2020.01); *G06F 30/392* (2020.01)

(58) Field of Classification Search
CPC .............................. G06F 30/394; G06F 30/392
USPC ........................................................ 716/126
See application file for complete search history.

(56) References Cited

U.S. PATENT DOCUMENTS

| 6,091,263 A | 7/2000 | New et al. |
|---|---|---|
| 6,150,839 A | 11/2000 | New |
| 6,204,687 B1 | 3/2001 | Schultz et al. |
| 6,462,579 B1 | 10/2002 | Camilleri et al. |
| 6,507,211 B1 | 1/2003 | Schultz et al. |
| 6,525,562 B1 | 2/2003 | Schultz et al. |
| 6,526,557 B1 | 2/2003 | Young et al. |
| 6,573,748 B1 | 6/2003 | Trimberger |
| 6,625,794 B1 | 9/2003 | Trimberger |
| 6,759,869 B1 | 7/2004 | Young et al. |

(Continued)

FOREIGN PATENT DOCUMENTS

| EP | 2871589 A1 * | 5/2015 | ............. | G06F 30/34 |
|---|---|---|---|---|
| EP | 3136253 A1 * | 3/2017 | ............. | G06F 30/39 |
| EP | 3418905 A2 * | 12/2018 | ............. | G06F 30/39 |

OTHER PUBLICATIONS

"SDAccel Environment User Guide," UG1023 (v2018.3), Xilinx, Inc., Jan. 24, 2019, p. 165.

*Primary Examiner* — Suresh Memula

(74) *Attorney, Agent, or Firm* — Kevin T. Cuenot

(57) ABSTRACT

A design for a programmable integrated circuit (IC) is synthesized and includes an inference engine and a data transformer. A portion of the design including the data transformer is designated as a dynamic function exchange (DFX) module. The inference engine is excluded from the DFX module. The design is implemented, by placing and routing, such that the DFX module is confined to a defined physical area of the programmable integrated circuit. An abstract shell for the design specifying boundary connections of the DFX module as placed and routed is generated. A locked version of the design as placed and routed with the DFX module removed is generated. The method includes implementing a different data transformer as a further DFX module for the design using the abstract shell.

20 Claims, 9 Drawing Sheets

300

For a design for a programmable integrated circuit that is synthesized and includes an inference engine and a first data transformer, designate a portion of the design including the data transformer as a dynamic function exchange (DFX) module, wherein the inference engine is excluded from the DFX module
302

Implement, by placing and routing, the design such that the DFX module is confined to a defined physical area of the programmable integrated circuit
304

Generate an abstract shell for the design specifying boundary connections of the DFX module as placed and routed
306

Generate a locked version of the design as placed and routed with the DFX module removed
308

Implement a different data transformer as a further DFX module for the design using the abstract shell.
310

(56) References Cited

U.S. PATENT DOCUMENTS

| | | | |
|---|---|---|---|
| 6,810,514 B1 | 10/2004 | Alfke et al. | |
| 6,836,842 B1 | 12/2004 | Guccione et al. | |
| 6,907,595 B2 | 6/2005 | Curd et al. | |
| 7,024,651 B1 | 4/2006 | Camilleri et al. | |
| 7,057,413 B1 | 6/2006 | Young et al. | |
| 7,109,750 B2 | 9/2006 | Vadi et al. | |
| 7,124,338 B1 | 10/2006 | Mark et al. | |
| 7,138,820 B2 | 11/2006 | Goetting et al. | |
| 7,218,137 B2 | 5/2007 | Vadi et al. | |
| 7,224,184 B1 | 5/2007 | Levi et al. | |
| 7,233,532 B2 | 6/2007 | Vadi et al. | |
| 7,235,999 B2 | 6/2007 | Goetting et al. | |
| 7,302,625 B1 | 11/2007 | Payakapan et al. | |
| 7,477,072 B1 | 1/2009 | Kao et al. | |
| 7,478,357 B1 | 1/2009 | Mason et al. | |
| 7,482,836 B2 | 1/2009 | Levi et al. | |
| 7,509,617 B1 | 3/2009 | Young | |
| 7,518,396 B1 | 4/2009 | Kondapalli et al. | |
| 7,546,572 B1 | 6/2009 | Ballagh et al. | |
| 7,599,299 B2 | 10/2009 | Goetting et al. | |
| 7,619,442 B1 | 11/2009 | Mason et al. | |
| 7,640,526 B1 * | 12/2009 | Blodget | G06F 15/7867 |
| | | | 703/22 |
| 7,640,527 B1 * | 12/2009 | Dorairaj | G06F 30/34 |
| | | | 716/139 |
| 7,724,815 B1 | 5/2010 | Raha et al. | |
| 7,746,099 B1 | 6/2010 | Chan et al. | |
| 7,827,510 B1 * | 11/2010 | Schubert | G06F 30/331 |
| | | | 716/111 |
| 7,890,916 B1 * | 2/2011 | Donlin | G01R 31/318519 |
| | | | 716/108 |
| 7,941,777 B1 * | 5/2011 | Young | G06F 30/34 |
| | | | 716/126 |
| 8,102,188 B1 | 1/2012 | Chan et al. | |
| 8,359,448 B1 | 1/2013 | Neuendorffer | |
| 8,415,974 B1 | 4/2013 | Lysaght | |
| 8,635,571 B1 * | 1/2014 | Goldman | G06F 30/34 |
| | | | 716/117 |
| 8,719,750 B1 | 5/2014 | Balzli, Jr. | |
| 8,910,109 B1 * | 12/2014 | Orthner | H03K 19/003 |
| | | | 716/139 |
| 8,928,351 B1 | 1/2015 | Konduru | |
| 9,722,613 B1 | 8/2017 | Schultz et al. | |
| 10,296,699 B1 | 5/2019 | Yu et al. | |
| 10,558,777 B1 | 2/2020 | Yu et al. | |
| 10,608,641 B2 | 3/2020 | Yu et al. | |
| 10,621,299 B1 | 4/2020 | Yu et al. | |
| 10,642,630 B1 * | 5/2020 | Shaddock | G06F 9/44505 |
| 10,651,853 B1 | 5/2020 | Kong et al. | |
| 11,188,312 B2 * | 11/2021 | Sastry | G06F 30/343 |
| 11,681,846 B1 * | 6/2023 | Yang | G06F 30/34 |
| | | | 716/105 |
| 11,720,735 B2 * | 8/2023 | Turullols | G06F 30/3953 |
| | | | 716/119 |
| 2006/0190904 A1 * | 8/2006 | Haji-Aghajani | G06F 30/34 |
| | | | 326/38 |
| 2008/0216038 A1 * | 9/2008 | Bose | G06F 30/392 |
| | | | 716/118 |
| 2010/0030831 A1 * | 2/2010 | Standfield | G06F 17/142 |
| | | | 708/404 |
| 2014/0189622 A1 * | 7/2014 | Titley | G06F 30/34 |
| | | | 716/105 |
| 2016/0048623 A1 * | 2/2016 | Emirian | G06F 30/398 |
| | | | 716/105 |
| 2017/0286582 A1 * | 10/2017 | Khan | G06F 30/34 |
| 2019/0303311 A1 * | 10/2019 | Bilski | G06F 13/1657 |
| 2019/0303328 A1 * | 10/2019 | Balski | G06F 15/7807 |
| 2020/0371759 A1 * | 11/2020 | Sastry | G06F 8/41 |
| 2020/0371787 A1 * | 11/2020 | Gupta | G06F 9/5011 |
| 2022/0108211 A1 * | 4/2022 | K T | G06N 20/00 |

* cited by examiner

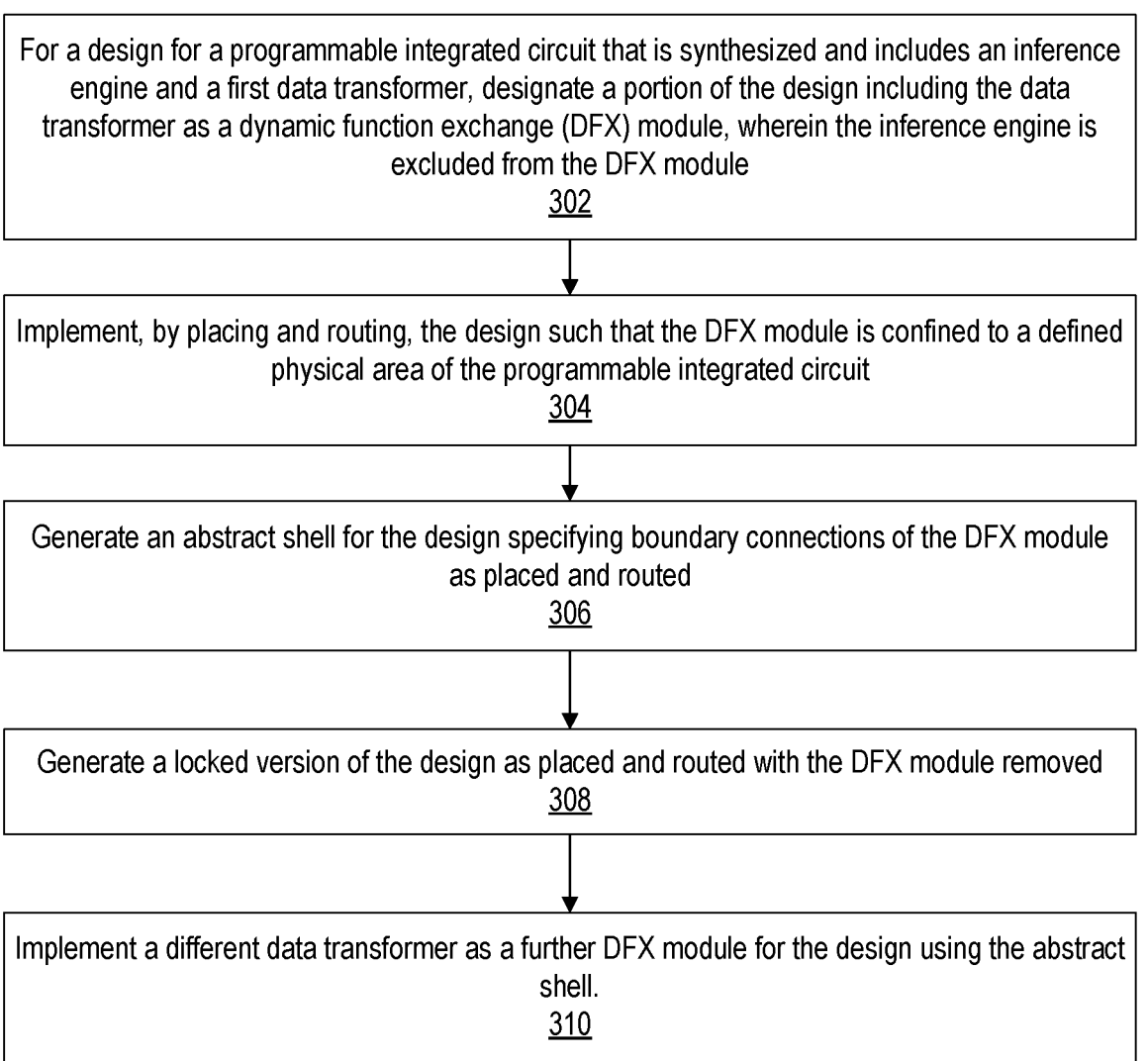

300

For a design for a programmable integrated circuit that is synthesized and includes an inference engine and a first data transformer, designate a portion of the design including the data transformer as a dynamic function exchange (DFX) module, wherein the inference engine is excluded from the DFX module
302

Implement, by placing and routing, the design such that the DFX module is confined to a defined physical area of the programmable integrated circuit
304

Generate an abstract shell for the design specifying boundary connections of the DFX module as placed and routed
306

Generate a locked version of the design as placed and routed with the DFX module removed
308

Implement a different data transformer as a further DFX module for the design using the abstract shell.
310

Generate exclusive physical area for
programmable IC to include data transformer
by creating a PBlock
502

Determine location and size of PBlock
504

Set parameter of PBlock to indicate DFX
module
506

Perform placement and routing on design while
observing constraints of the PBlock or
exclusive physical area
508

900

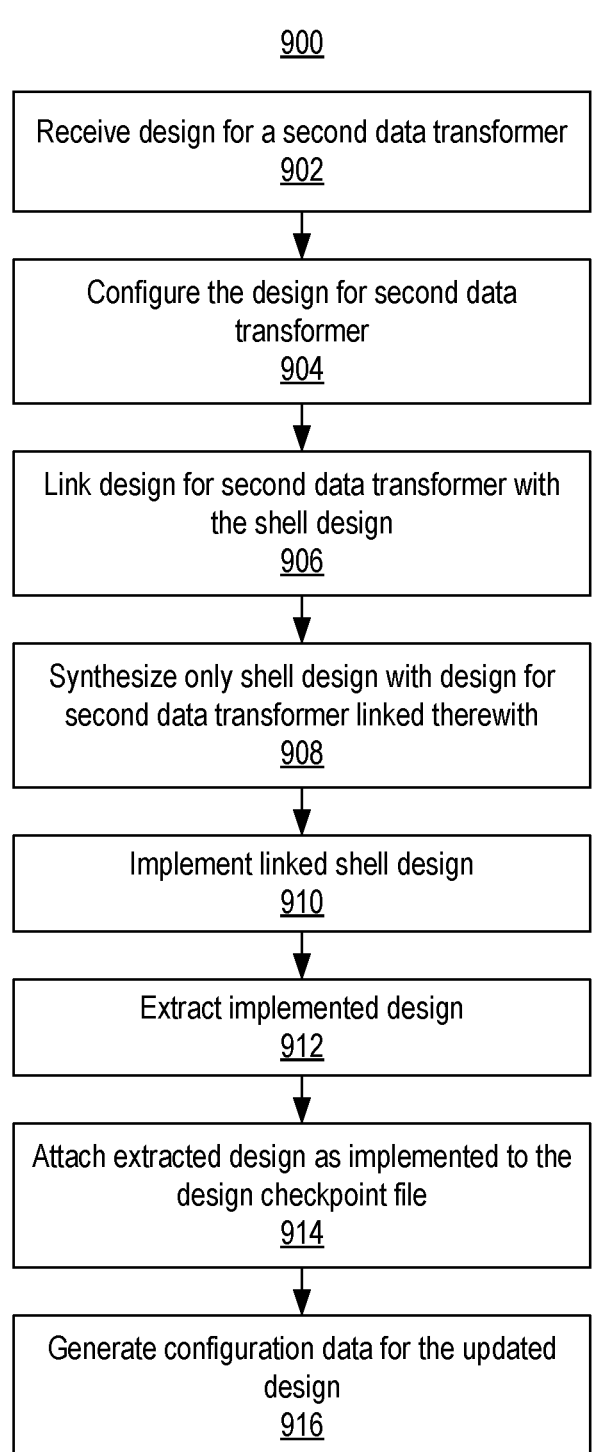

Receive design for a second data transformer
902

Configure the design for second data transformer
904

Link design for second data transformer with the shell design
906

Synthesize only shell design with design for second data transformer linked therewith
908

Implement linked shell design
910

Extract implemented design
912

Attach extracted design as implemented to the design checkpoint file
914

Generate configuration data for the updated design
916

FIG. 9

BUILD FLOW FOR IMPLEMENTING ARTIFICIAL INTELLIGENCE APPLICATIONS IN PROGRAMMABLE INTEGRATED CIRCUITS

TECHNICAL FIELD

This disclosure relates to integrated circuits (ICs) and, more particularly, to build flows for implementing artificial intelligence applications in programmable ICs.

BACKGROUND

Artificial intelligence (AI) refers to an area of science and engineering that seeks to develop intelligent machines. An AI application is an application that is capable of performing inferencing. The inferencing is often performed using machine learning, which is a branch of AI and computer science capable of improving automatically through experience and through the processing of data. AI applications tend to be computationally intensive in that the portion of the AI application that performs inferencing is usually formed of a multilayered computational architecture. Typically, AI applications are implemented in software that executes on one or more central processing units (CPUs) or other processors.

Significant improvement in performance of an AI application may be achieved by hardware accelerating the inferencing portion of the AI application. The AI application, however, may include various other pre-processing and/or post-processing functions. Further improvements in performance of the AI application may be achieved by also hardware accelerating the pre-processing and/or post-processing functions.

In some cases, the AI application, being a user design, may be implemented in a dynamic function exchange (DFX) region of a programmable integrated circuit (IC). Another region referred to as the static region of the programmable IC may implement other circuitry such as a platform, which is circuitry configured to communicate with, for example, a host data processing system, the user design implemented in the DFX region, and/or memory. Different applications may be implemented in the DFX region over time (e.g., via the reconfigurable nature of the programmable IC) while the circuitry implemented in the static region of the programmable IC continues to operate uninterrupted.

A hardware accelerated AI application, however, can be time consuming to implement. The runtime required by the implementation tools to implement the DFX region including the AI application may take many hours to complete. Unfortunately, any change to the inferencing portion, the pre-processing portion, and/or the post-processing portion of the AI application requires re-running the implementation tools to completely rebuild the hardware accelerated design anew. As may be appreciated, significant development time may be consumed in consequence of implementing relatively small changes and/or fixes to the AI application. Further, reuse of the inferencing portion of the AI application with different pre-processing and/or post-processing functions to generate new and/or different AI applications is equally time consuming.

SUMMARY

In one or more example implementations, a method includes, for a design for a programmable integrated circuit that is synthesized and includes an inference engine and a data transformer, designating a portion of the design including the data transformer as a dynamic function exchange (DFX) module. The inference engine is excluded from the DFX module. The method includes implementing, by placing and routing, the design such that the DFX module is confined to a defined physical area of the programmable integrated circuit. The method includes generating an abstract shell for the design specifying boundary connections of the DFX module as placed and routed. The method includes generating a locked version of the design as placed and routed with the DFX module removed. The method includes implementing a different data transformer as a further DFX module for the design using the abstract shell.

The foregoing and other implementations can each optionally include one or more of the following features, alone or in combination. Some example implementations include all the following features in combination.

In some aspects, the method includes attaching the different data transformer, as implemented, to the locked version of the design.

In some aspects, the DFX module is a nested DFX module.

In some aspects, implementing the different data transformer includes performing placement and routing of the different data transformer to fit within the defined physical area.

In some aspects, the defined physical area is defined by creating a data structure associated with the data transformer. The data structure specifies a size and a location of the defined physical area on the programmable integrated circuit.

In some aspects, the method includes setting a size parameter of the data structure based on resource usage of the data transformer.

In some aspects, the method includes setting a location parameter of the data structure to specify a location that is non-obstructing of buses of the design.

In some aspects, the busses include buses linking the inference engine to other components of the programmable integrated circuit.

In some aspects, the location specified by the location parameter is determined so that signals between the defined physical area and the memory meet predetermined timing constraints.

In one or more example implementations, a computer program product includes one or more computer readable storage mediums having program instructions embodied therewith. The program instructions are executable by computer hardware, e.g., a hardware processor, to cause the computer hardware to initiate and/or execute operations as described within this disclosure.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 3 illustrates an example method of operation for processing an AI application for implementation in a programmable IC.

FIG. 9 illustrates an example method of replacing the data transformer of the design with a different data transformer.

DETAILED DESCRIPTION

Figure 1:
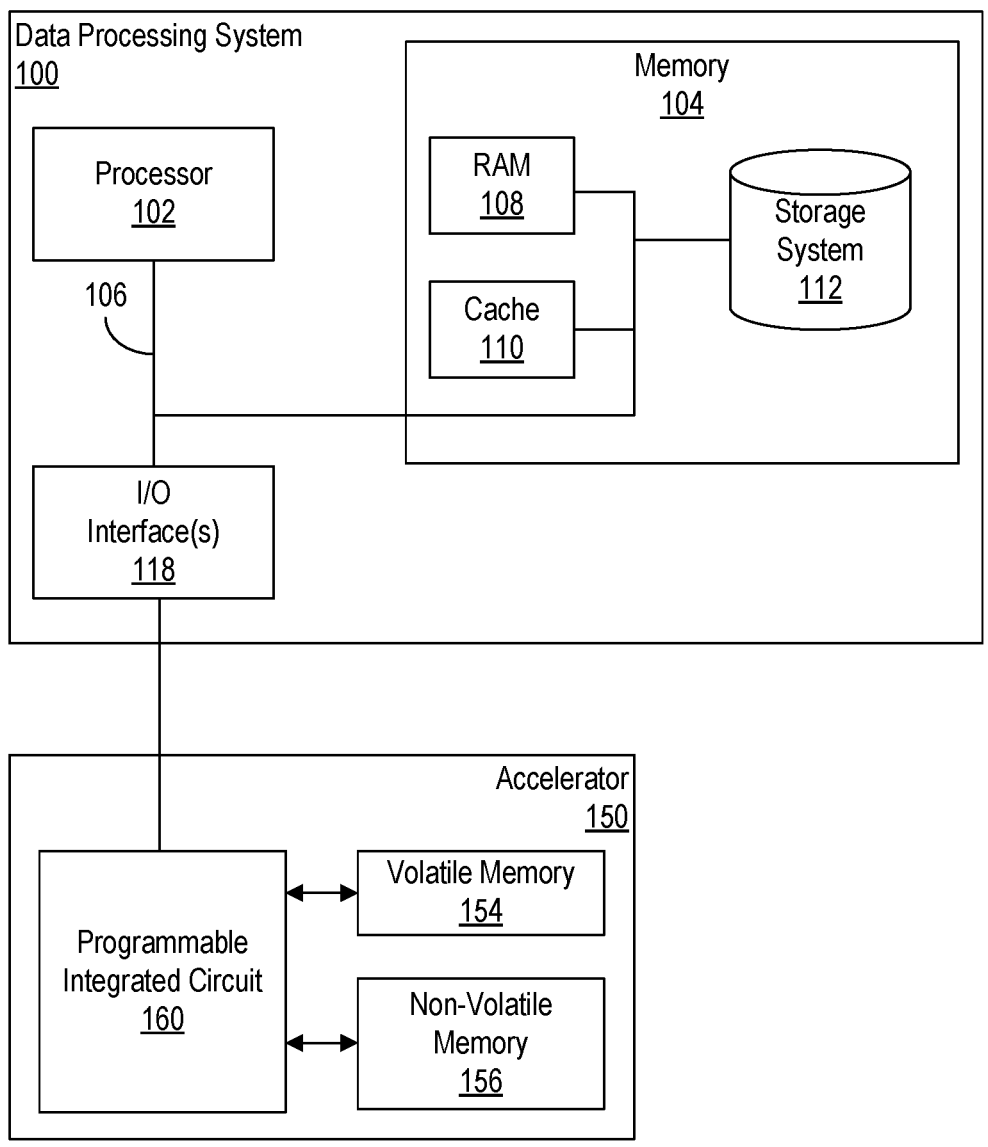
FIG. 1 illustrates an example computing system in which the inventive arrangements may be implemented.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to build flows for implementing artificial intelligence (AI) applications in programmable ICs. In accordance with the inventive arrangements described within this disclosure, methods, systems, and computer program products are provided for hardware accelerating AI applications. An AI application includes an inference engine, a pre-processing function, and optionally a post-processing function. Within this disclosure, pre-processing functions and post-processing functions are referred to as data transformers. Rather than hardware accelerating only the inference engine of the AI application, whole application acceleration is performed that hardware accelerates both the inference engine and one or more or all of the data transformers that may be included in the AI application.

In one or more example implementations, the AI application is implemented using dynamic function exchange (DFX) technology. In scenarios involving a host data processing system in communication with the programmable IC (e.g., a cloud computing enabled computing architecture), the AI application is implemented using nested DFX technology. The AI application is coupled to a platform that provides various input/output functions for the AI application to access memory and/or communicate with a host data processing system. In implementing the AI application using nested DFX technology, the AI application is implemented in a DFX module with the data transformer being implemented in a nested DFX module within the higher level DFX module. The inference engine of the AI application is transformed into what is effectively a static region of circuitry that is locked in place along with the platform. By locking the inference engine implementation and the platform in place, different data transformers may be swapped into the DFX region of the programmable IC corresponding to the nested DFX region to operate with the inference engine over time. In doing so, only the DFX region (e.g., the nested DFX region in this case) including the data transformer(s) needs to be re-implemented, thereby significantly reducing the runtime of the implementation tools.

In one or more other examples involving scenarios in which the programmable IC includes an embedded processor/processing system such that the programmable IC need not be in communication with a host data processing system, DFX technology also may be used. In that case, the AI application is implemented using DFX technology where the data transformer is included in a DFX module while the inference engine is excluded therefrom. In this type of implementation, platform circuitry is not included as the programmable IC has no need to communicate with a host data processing system. Still, the inference engine implementation, which is outside of the DFX region, is effectively locked. Different data transformers may be swapped into the DFX region of the programmable IC corresponding to the DFX module to operate with the inference engine over time. In doing so, only the DFX region including the data transformer(s) needs to be re-implemented, thereby significantly reducing the runtime of the implementation tools.

The inventive arrangements described within this disclosure save a significant amount of time since the entire AI application need not be re-implemented when different data transformer(s) are desired. In many cases, the data transformer(s) consume approximately 5-10% of the programmable IC resources. In some cases, the data transformer(s) consume less than 5% while in others the data transformer(s) consume more than 10%. In any case, a majority of the resources of the programmable IC are devoted to implementing the inference engine of the AI application. As may be appreciated given the resource utilization of the various portions of the AI application, only having to implement the data transformer(s) and not the entire AI application when modifying the data transformer(s) means that an updated version or new version of the AI application that utilizes different data transformer(s) may be implemented much faster and with fewer computational resources than had the entire AI application been re-implemented.

One significant challenge in hardware accelerating an AI application is achieving timing closure for the design. The inventive arrangements address this technological challenge by creating a hardware accelerated version of the AI application with the inference engine (e.g., the more significant use of resources of the programmable IC) that meets timing and is thereafter locked. As such, to use one or more different data transformers with the inference engine requires that a much smaller portion of the AI application be reimplemented. Timing closure with respect to most of the AI application, e.g., the inference engine and/or platform—one or both of which may or may not have been designed by the user, has been achieved by virtue of the locked portions of the design and is no longer a significant challenge.

Further aspects of the inventive arrangements are described below with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example computing system in which the inventive arrangements may be implemented. As shown, the example computing system includes a data processing system 100. As defined herein, the term "data processing system" means one or more hardware systems configured to process data, each hardware system including at least one hardware processor and memory, wherein the hardware processor is programmed with computer-readable instructions that, upon execution, initiate operations. Data processing system 100 can include a processor 102, a memory 104, and a bus 106 that couples various system components including memory 104 to processor 102. Data processing system 100 is an example implementation of a host data processing system.

Processor 102 may be implemented as one or more processors. In an example, processor 102 is implemented as a CPU. Processor 102 may be implemented as one or more circuits, e.g., hardware, capable of carrying out instructions contained in program code. The circuit may be an integrated circuit or embedded in an integrated circuit. Processor 102 may be implemented using a complex instruction set computer architecture (CISC), a reduced instruction set computer architecture (RISC), a vector processing architecture, or other known architectures. Example processors include, but are not limited to, processors having an x86 type of architecture (IA-32, IA-64, etc.), Power Architecture, ARM processors, and the like.

Bus 106 represents one or more of any of a variety of communication bus structures. By way of example, and not limitation, bus 106 may be implemented as a PCIe bus. Data processing system 100 typically includes a variety of computer system readable media. Such media may include computer-readable volatile and non-volatile media and computer-readable removable and non-removable media.

Memory 104 can include computer-readable media in the form of volatile memory, such as random-access memory (RAM) 108 and/or cache memory 110. Data processing system 100 also can include other removable/non-removable, volatile/non-volatile computer storage media. By way of example, storage system 112 can be provided for reading from and writing to a non-removable, non-volatile magnetic and/or solid-state media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 106 by one or more data media interfaces. Memory 104 is an example of at least one computer program product.

Memory 104 is capable of storing computer-readable program instructions that are executable by processor 102. For example, the computer-readable program instructions can include an operating system, one or more application programs, other program code, and program data. Processor 102, in executing the computer-readable program instructions, is capable of performing the various operations described herein that are attributable to a computer. It should be appreciated that data items used, generated, and/or operated upon by data processing system 100 are functional data structures that impart functionality when employed by data processing system 100.

As defined within this disclosure, the term "data structure" means a physical implementation of a data model's organization of data within a physical memory. As such, a data structure is formed of specific electrical or magnetic structural elements in a memory. A data structure imposes physical organization on the data stored in the memory as used by an application program executed using a processor.

Data processing system 100 may include one or more Input/Output (I/O) interfaces 118 communicatively linked to bus 106. I/O interface(s) 118 allow data processing system 100 to communicate with one or more external devices. Examples of I/O interfaces 118 may include, but are not limited to, network cards, modems, network adapters, hardware controllers, etc. Examples of external devices include devices that allow a user to interact with data processing system 100 (e.g., a display, a keyboard, and/or a pointing device).

Another example of an external device is accelerator 150. In the example, via I/O interface(s) 118, data processing system 100 may offload computational tasks such as inference operations as described herein to accelerator 150 and programmable IC 160.

Data processing system 100 is only one example implementation. Data processing system 100 can be practiced as a standalone device (e.g., as a user computing device or a server, as a bare metal server), in a cluster (e.g., two or more interconnected computers), or in a distributed cloud computing environment (e.g., as a cloud computing node) where tasks are performed by remote processing devices that are linked through a communications network. In a distributed cloud computing environment, program modules may be located in both local and remote computer system storage media including memory storage devices.

In an example implementation, I/O interface 118 may be implemented as a PCIe adapter. Data processing system 100 and accelerator 150 communicate over a communication channel, e.g., a PCIe communication channel. Accelerator 150 may be implemented as a circuit board that couples to data processing system 100. Accelerator 150 may, for example, be inserted into a card slot, e.g., an available bus and/or PCIe slot, of data processing system 100.

Accelerator 150 may include programmable IC 160. Accelerator 150 also may include a volatile memory 154 coupled to programmable IC 160 and a non-volatile memory 156 also coupled to programmable IC 160. Volatile memory 154 may be implemented as a RAM. In some cases, volatile memory 154 and/or another volatile memory may be included within programmable IC 160. Non-volatile memory 156 may be implemented as flash memory.

Programmable IC 160 may be implemented as any of a variety of different types of ICs that include programmable circuitry. An example of programmable circuitry is programmable logic. As defined within this disclosure, the terms "programmable circuitry" and "programmable logic" mean circuitry used to rebuild reconfigurable digital circuits. Unlike hardwired circuitry, programmable circuitry has an undefined function at the time of manufacture. Prior to use, programmable circuitry must be programmed or "configured" using configuration data referred to as a configuration bitstream.

Programmable IC 160 may be implemented as any of a variety of different types of ICs that include at least some programmable circuitry. Examples include, but are not limited to, a System-on-Chip (SoC), a Field Programmable Gate Array, an Application-Specific IC (ASIC), or the like. Programmable IC 160 is an adaptive IC in that programmable IC 160 may be updated subsequent to deployment of the device into the field. An adaptive IC may be optimized, e.g., configured or reconfigured, for performing particular operations after deployment. The optimization may be performed repeatedly over time to meet different requirements or needs.

Data processing system 100 is only one example implementation. Data processing system 100 can be practiced as a standalone device (e.g., as a user computing device or a server, as a bare metal server), in a cluster (e.g., two or more interconnected computers), or in a distributed cloud computing environment (e.g., as a cloud computing node) where tasks are performed by remote processing devices that are linked through a communications network. In a distributed cloud computing environment, program modules may be located in both local and remote computer system storage media including memory storage devices.

The example of FIG. 1 is also an example of a "cloud computing" enabled architecture. As used herein, the term "cloud computing" refers to a computing model that facilitates convenient, on-demand network access to a shared pool of configurable computing resources such as networks, servers, storage, applications, ICs (e.g., programmable ICs) and/or services. These computing resources may be rapidly provisioned and released with minimal management effort or service provider interaction. Cloud computing promotes availability and may be characterized by on-demand self-service, broad network access, resource pooling, rapid elasticity, and measured service.

In other example implementations, programmable IC 160 may be included in a larger electronic system and include an embedded processor and/or processor system therein. In such an implementation, data processing system 100 (e.g., a host) may be omitted in terms of runtime operation.

Figure 2A:
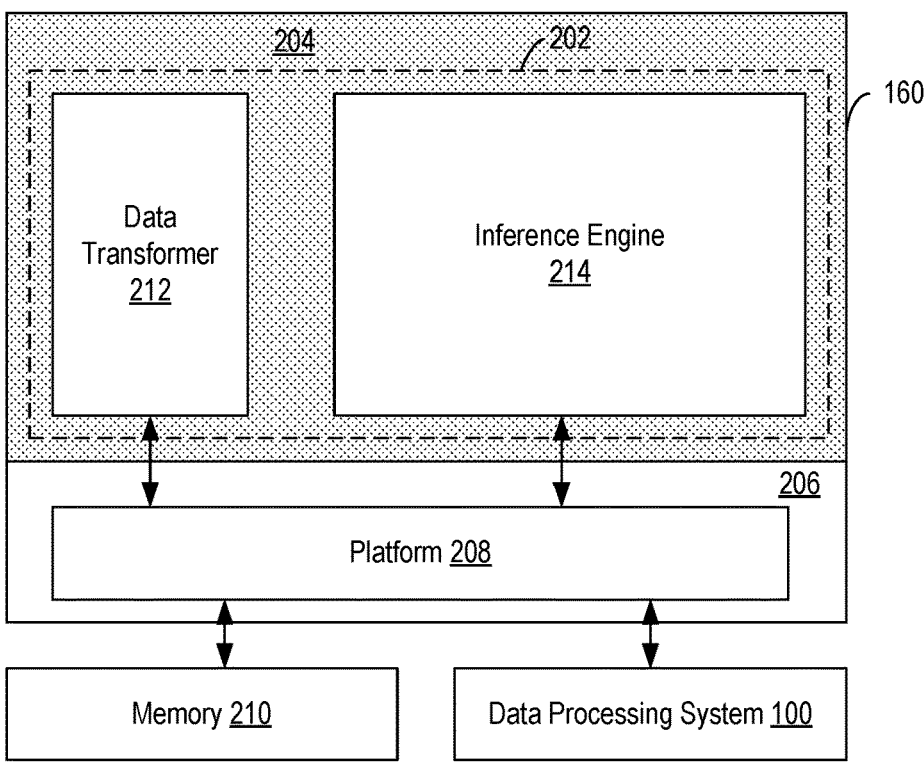
FIGS. 2A, 2B, and 2C, taken collectively, illustrate aspects of example build flows for implementing artificial intelligence (AI) applications in programmable integrated circuits (ICs).
Figure 2B:
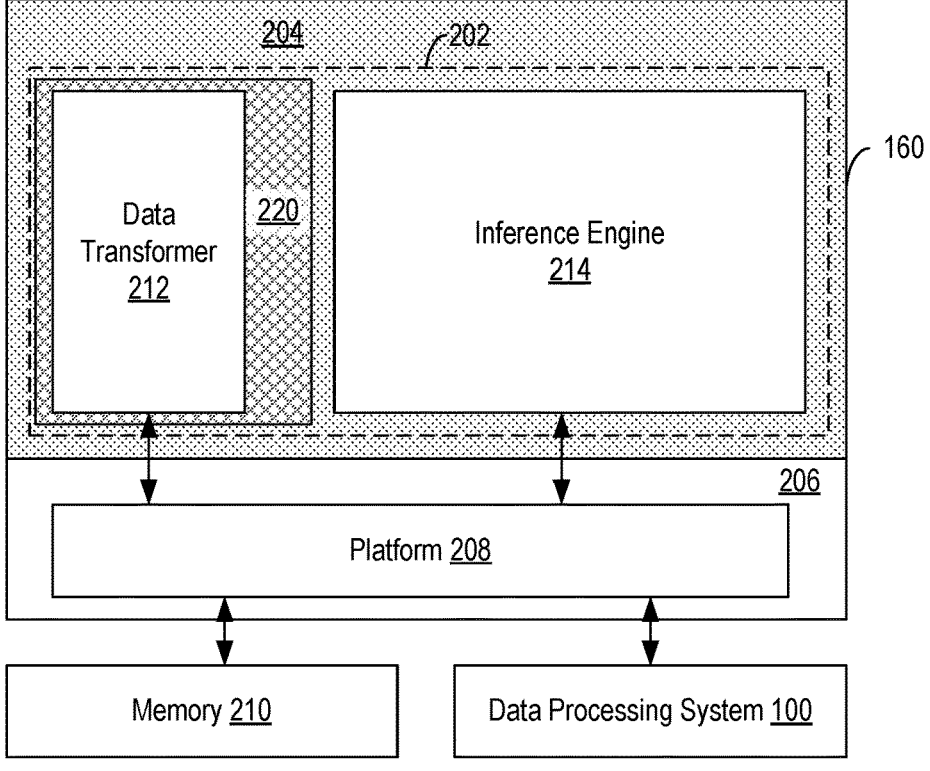
Figure 2C:
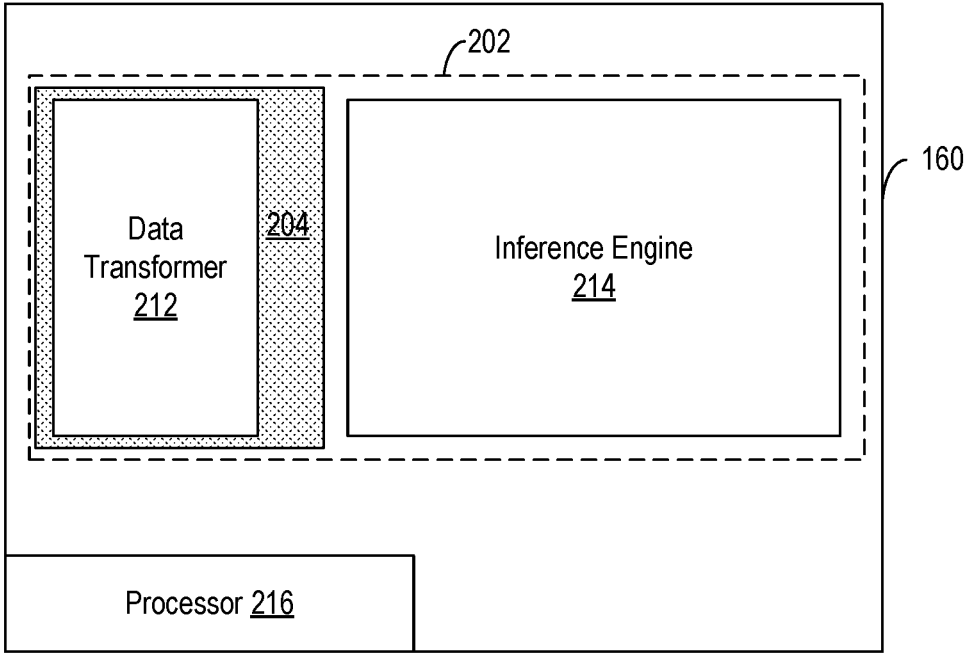

FIGS. 2A, 2B, and 2C, taken collectively, illustrate aspects of example build flows for implementing AI applications in programmable ICs. FIGS. 2A, 2B, and 2C are collectively referred to herein as FIG. 2.

Referring to FIG. 2A, an example where an AI application 202 is implemented using DFX technology is illustrated. AI application 202 is hardware accelerated and implemented within programmable IC 160. Initially, AI application 202 is implemented within a DFX region 204. DFX region 204 (e.g., also referred to as a partial reconfiguration region) is shown in programmable IC 160 with shading. DFX region 204 is a region including programmable circuitry that is reserved for implementing one or more different custom circuit designs dynamically over time. The custom circuit designs are included in DFX modules of the circuit design. It should be appreciated that the terms module and region may be used interchangeably within this disclosure form time-to-time as DFX modules of a circuit design are implemented in corresponding DFX regions of programmable IC 160. Programmable IC 160 can include more than one DFX region. Dynamic region 204 also may include one or more other miscellaneous logic circuits (not shown).

Platform 208 is implemented in a portion of programmable IC 160 that is external to DFX region 204 called static region 206. Platform 208 is circuitry that provides input/output functions and/or memory access functions within programmable IC 160 for user circuitry implemented in dynamic region 204. For example, platform 208 may specify circuitry that may be used by user designs and/or kernels thereof to store incoming data from the host data processing system as well as processed data. Providing platform 208 preconfigured allows development of the user circuitry implemented in dynamic region 204 to focus on functionality without having to implement data transfer circuitry to move data into and out the circuitry being developed. For example, platform 208 may implement one or more memory controllers for communicating with a memory such as memory 210 and/or bus endpoint circuitry for communicating with data processing system 100. It should be appreciated that in some implementations, portions of AI application 202 may communicate directly with memory 210. Static region 206 refers to programmable circuitry of programmable IC 160 that implements a circuit design that does not change, e.g., remains static. Thus, while circuitry in DFX region 206 can be changed to implement other, different custom circuit designs over time, the circuitry in static region 206, e.g., platform 208, continues to operate uninterrupted.

In the example, the entirety of AI application 202 is implemented in dynamic region 204. That is, both of data transformer 212 and inference engine 214 are implemented in dynamic region 204, at least initially. For purposes of illustration, consider an example in which AI application 202 performs image processing. Inference engine 214 may be implemented as a machine learning design such as a deep neural network. Inference engine 214 is capable of detecting particular objects within images provided thereto as input data. The detection or lack of detection of the particular objects may be specified as output data generated by inference engine 214. Data transformer 212 may represent preprocessing circuitry that operates on input data provided to inference engine 214, post-processing circuitry that operates on output data generated by inference engine 214, or both pre-processing circuitry and post-processing circuitry depending on the type of AI application 202 that is hardware accelerated. In this sense, AI application 202 includes data transformer 212 that represents at least one of pre-processing circuitry or post-processing circuitry. In the example, each of data transformer 212 and inference engine 214 receives input from memory 210 by way of platform 208 and/or receives data directly from memory 210 (e.g., not through platform 208). Similarly, each of data transformer 212 and inference engine 214 outputs result data to memory 210 by way of platform 208 and/or directly to memory 210 (e.g., not through platform 208).

Memory 210 may be implemented as random-access memory (RAM). In one or more example implementations, memory 210 is implemented as Double Data Rate RAM (DDR) or other suitable and/or available RAM. In one or more example implementations, memory 210 is implemented as a High-Bandwidth Memory (HBM). Memory 210 may be located in the same package as programmable IC 160 whether on a die that is separate from die(s) used to implement platform 208 and/or AI application 202 or on a same die. In another example, memory 210 may be located off-chip as a separate package than programmable IC 160.

In implementing a custom circuit design, the Electronic Design Automation (EDA) tools (e.g., computer executed design implementation tools) must interface the custom circuit design, e.g., AI application 202 which may be specified within a DFX module, with a design specifying platform 208. The custom circuit design must undergo synthesis, placement, and routing, for example, to ensure that the custom circuit design correctly connects to the design specifying platform 208 for programmable IC 160. This process is time consuming, often taking many hours and significant computational resources to complete. This is particularly true given that both data transformer 212 and inference engine 214 are included in DFX region 204. Thus, any change to data transformer 212, inference engine 214, and/or platform 208 necessitates performing the entire design implementation flow anew.

In most cases, the data to be provided to inference engine 214 requires some additional processing. This additional processing, as performed by data transformer 212, ensures that the input data matches the format expected by inference engine 214. For example, the input data stored in memory 210 may be images that are generated from a web-camera, received from a network, or may be raw images from a sensor. To perform inference on the input data, the images may require resizing, conversion from color to grayscale, and/or decoding (e.g., JPEG decoding or other decoding). Further pre-processing operations may include, but are not limited to, resizing, cropping, letterboxing, color conversion, normalization, blurring, rotation, affine transformations, segmentations, removal of background color, optical flow, and the like.

Data transformer 212 retrieves input data from memory 210, performs the pre-processing functions, and stores the resulting data back to memory 210. Once the pre-processing operations are performed, inference engine 214 may retrieve the processed input data, perform inference, and store any output data back to memory 210. A different data transformer, e.g., post-processing circuitry, if required or included, may operate on the output data generated by inference engine 214. The different data transformer, for example, may apply filters, non-maximal matching algorithms, or other processes. Like the pre-processing circuitry, the post-processing circuitry obtains the data from memory 210, operates on the data, and writes the resulting data back to memory 210. As noted, one or both of the pre-processing circuitry and the post-processing circuitry are represented by data transformer 212 in FIG. 2A.

As may be appreciated, any variation to data transformer 212 or to inference engine 214 necessitates re-implementation of AI application 202, which is time consuming. Such variations may include changes to AI application 202 that may occur as part of a development process, swapping the pre-processing circuitry and/or post-processing circuitry to implement a new and/or different AI application that utilizes the same inference engine, or the like. Each of these types of changes requires implementing AI application 202 anew in the example of FIG. 2A.

In the example of FIG. 2B, the implementation of AI application 202 has changed. In the example of FIG. 2B, data transformer 212 is implemented in a DFX region 220 that is nested within DFX region 204. DFX region 220 may be referred to as a nested DFX region. As discussed hereinbelow, the creation of a nested DFX region such as DFX region 220 effectively renders the surrounding portions of DFX region 204 static. As pictured, DFX region 220 includes only data transformer 212. Inference engine 214 is excluded from DFX region 220. Static region 206 still includes platform 208. This process allows one to more easily change or swap out data transformer 212 for a different data transformer to make modifications (e.g., change and/or add and/or remove pre-processing circuitry and/or post processing circuitry) to create new and/or different AI applications or to improve or debug an existing AI application while significantly reducing the implementation time required. That is, the implementation (e.g., placement and routing) of both platform 208 and inference engine 214 may remain unchanged while only circuitry within dynamic region 204 changes and requires re-implementation. The runtime of the EDA tools may be reduced from 10 or more hours to only several hours or less in some cases.

FIGS. 2A and 2B are illustrative of a cloud-based computing architecture. FIG. 2C illustrates an example where programmable IC 160 includes an embedded processor/processor system illustrated as processor 216. In the example of FIG. 2C, which corresponds to a "flat flow" design, a static region with a platform is not included as the host processor is embedded in programmable IC 160 itself. In this example, performing the example build flows described herein creates a static region. Data transformer 212 is included in a standalone (e.g., non-nested) DFX region 204. The other portions of programmable IC 160 surrounding DFX region 204 are considered the static region (e.g., static circuitry).

As may be appreciated, any variation to data transformer 212 or to inference engine 214, without using DFX region 204 as illustrated in FIG. 2C, necessitates re-implementation of the entirety of the circuit design implemented in programmable IC 160, which is time consuming. Such variations may include changes to AI application 202 that may occur as part of a development process, swapping the pre-processing circuitry and/or post-processing circuitry to implement a new and/or different AI application that utilizes the same inference engine, or the like.

FIG. 3 illustrates an example method 300 of operation for processing an AI application for implementation in a programmable IC. The operations described in connection with FIG. 3 May be performed by a data processing system executing suitable program code such as one or more EDA tools. An example of a data processing system that is capable of performing the operations of method 300 is data processing system 100 of FIG. 1. It should be appreciated that the data processing system need only be communicatively linked to a programmable IC and/or accelerator in cases where the resulting circuit design (e.g., configuration data) is loaded into the programmable IC. In describing method 300, the data processing system executing EDA tools is referred to as the "system."

Method 300 may begin in a state where a design for programmable IC 160 is created. The design may be synthesized and include an inference engine and a first data transformer. In block 302, the system designates a portion of the design including the data transformer as a DFX module. The inference engine is excluded from the DFX module.

In a cloud-based architecture as illustrated in the examples of FIGS. 2A and 2B, the design may connect to a platform. Initially, AI application 202, being included in a DFX module of the design, would be implemented in a DFX region. In block 302, the designation of the data transformer as a DFX module creates a nested DFX module as illustrated in FIG. 2B that includes only data transformer 212. The nested DFX module optionally may include one more other logic circuits but excludes inference engine 214. Any circuitry, e.g., the platform and/or inference engine, that is excluded from the DFX module is effectively implemented as static circuitry that becomes locked having a particular placement and routing.

In a flat design flow as illustrated in the example of FIG. 2C, the design may not connect to a platform. Any circuitry, e.g., infrastructure circuits and/or the inference engine, that is excluded from the DFX module is effectively implemented as static circuitry that becomes locked having a particular placement and routing.

In block 304, the system implements the design. For example, the system places and routes the design such that the DFX module (whether a DFX module or nested DFX module) is confined to a defined physical area of programmable IC 160. For example, data transformer 212, as specified as part of the DFX module, is confined to a defined physical area of the particular programmable IC in which the overall design is to be physically realized.

In block 306, the system generates an abstract shell for the design. The abstract shell specifies boundary connections of the DFX module as placed and routed. In block 308, the system generates a locked version of the design as placed and routed with the DFX module removed. In block 306, the system may implement a different data transformer as a further DFX module for the design using the abstract shell. For example, the system generates a design checkpoint file by removing the DFX module from the design and locking the design, as placed and routed, with the DFX module having been removed.

In block 310, the system implements a different data transformer as a different DFX module of the design using the abstract shell. The different data transformer may be a modified version of data transformer 212 or an entirely different data transformer. The different data transformer may include different and/or modified pre-processing circuitry, or post-processing circuitry, or both.

In one aspect, as part of block 310, the system attaches the implementation of the different data transformer to the locked version of the design. Having attached the second data transformer to the design checkpoint file, the resulting design may be further processed for implementation in the programmable IC. For example, the system may generate configuration data, e.g., a configuration bitstream, from the processed design that may be loaded into a programmable IC to physically implement the specified circuitry (e.g., the entire design including, if applicable, a platform, the data transformer(s), and inference engine) therein using programmable circuitry.

In an alternative aspect, as part of block 310, the implementation of the different data transformer may be performed directly and programmed into programmable IC 160 without having to attach the implementation of the different transformer to the locked circuit design as described (e.g., without generating a new full configuration bitstream for programmable IC 160).

In one or more example implementations, the system is capable of generating program code that is executable by the host system in communicating with accelerator 150 and/or programmable IC 160.

In one or more example implementations, the operations described within this disclosure in connection with the flow charts may be performed automatically, e.g., without user intervention. In one or more other examples, one or more operations may be performed in combination with user input, e.g., responsive to received user input.

Figure 4:
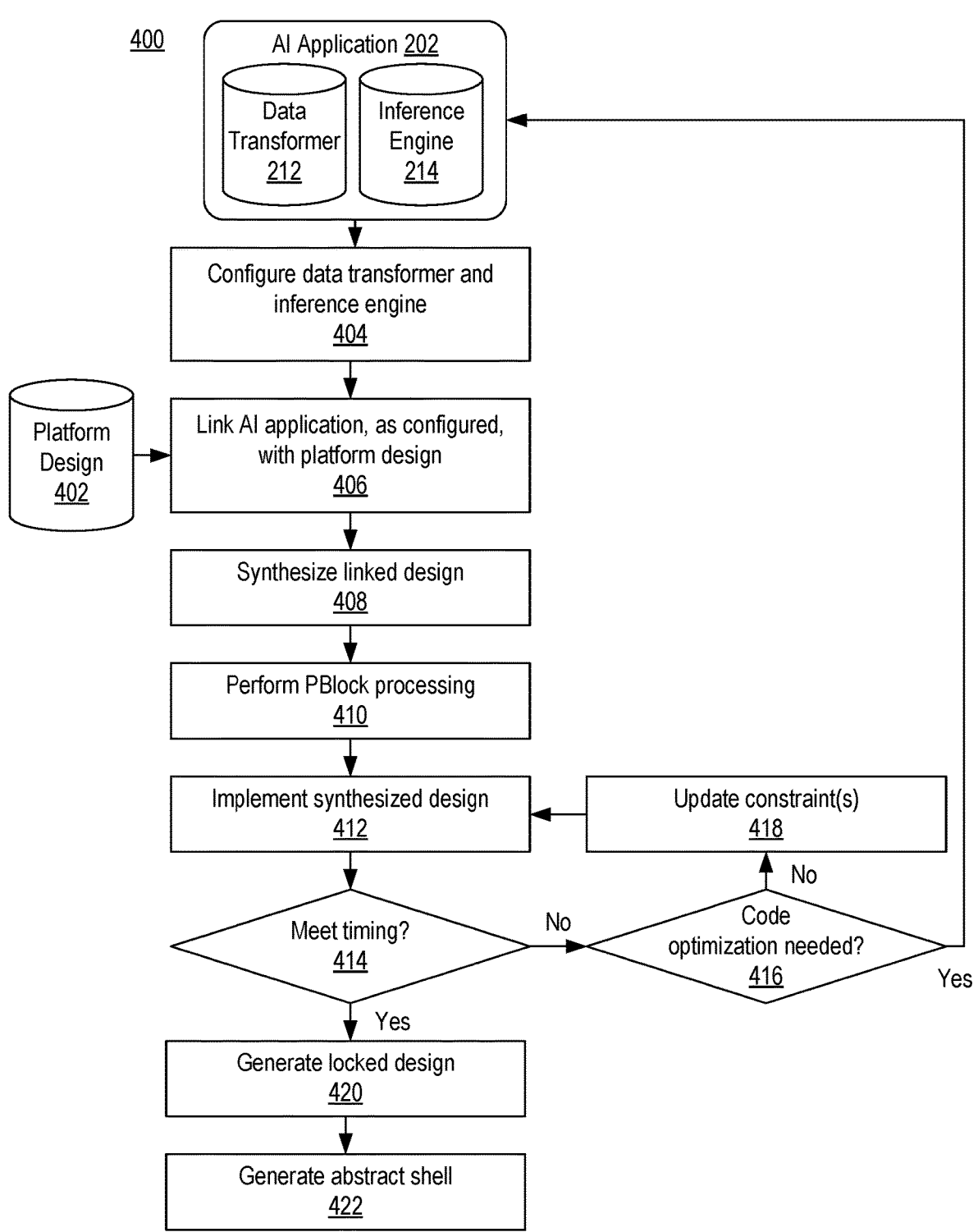
FIG. 4 is another example method of operation for processing an AI application for implementation in a programmable IC.

FIG. 4 is another example method 400 of operation for processing an AI application for implementation in a programmable IC. In the example, AI application 202 receives input data that underdoes pre-processing by data transformer 212. Inference engine 214 performs inference processing on the data as transformed by data transformer 212. Data transformer 212, or another data transformer, optionally performs post-processing on the results generated by inference engine 214 and produces the final output data. Each of the blocks of AI application 202 reads input from and writes output to a memory such as memory 210. The memory accesses may be performed through a platform, if included. In other example implementations, some components of data transformer 212 and/or inference engine 214 may communicate directly with one another.

AI application 202 may include a variety of different components such as kernels that form data transformer 212 and inference engine 214. The kernels may be specified in register transfer level (RTL) form and/or in other hardware description languages, in high-level programming languages (e.g., C/C++, SystemC), as Intellectual Property (IP) cores, or the like. Platform design 402 is optionally provided. In the example of FIG. 4, platform design 402 refers to the design data specifying platform 208 in FIG. 2.

In general, FIG. 4 illustrates more detailed example of blocks 302-308 of FIG. 3. In block 404, the system configures data transformer 212 and inference engine 214. For example, the system is capable of receiving the various kernels specified in one or more different formats as described above and generating object files that may be consumed and processed by an EDA tool such as a linker.

In block 406, the system links AI application 202. In the case where platform design 402 is provided, linker also links platform design 402 with AI application 202. In block 408, the system synthesizes the linked design.

In block 410, the system performs PBlock processing. As part of block 410, the system is capable of defining a PBlock. The system, as part of block 410, may also perform additional operations to incorporate the PBlock into the design. These additional operations may include determining a location of the PBlock on programmable IC 160, sizing the PBlock (e.g., determining dimensions of the PBlock), performing placement and routing of the design including the PBlock, closing timing, and the like. A more detailed description of block 410 is provided in connection with FIGS. 5-8.

The PBlock is a data structure that defines a collection of cells and one or more rectangular areas or regions that specify the device resources contained therein. A PBlock is used to floorplan a design by placing the portion of the circuit design contained in the PBlock to a particular physical region on programmable IC 160. Thus, the PBlock defines a physical region on programmable IC 160 referred to as an exclusive physical area. The PBlock may include designs for one or more different data transformers. Including the data transformer(s) within the PBlock ensures that the circuitry of the data transformer(s) (e.g., or any modules of the design) placed therein will be implemented in a confined region of programmable IC 160.

The PBlock, which ultimately may be designated as a nested DFX module corresponding to DFX region 220 of FIG. 2B or a DFX module corresponding to DFX module 204 of FIG. 2C, defines a location and size of the region on programmable IC 160. Other components of the design that are not within the PBlock are not included in the designated DFX region on programmable IC 160. Within this disclosure, the terms PBlock and exclusive physical area may be used interchangeably though PBlock refers to a data structure while the exclusive physical area refers to the actual region on the programmable IC in which the circuitry specified by the PBlock is implemented and confined.

In block 412, the system implements the synthesized design. For example, the system is capable of placing and routing the synthesized design with the PBlock having been specified therefor. In performing placement and routing, the system observes the constraints imposed by the PBlock.

In block 414, the system determines whether any specified timing objectives have been met. In response to determining that the timing objectives (e.g., timing constraints) have been met, method 400 continues to block 420. In response to determining that one or more timing objectives have not been met, method 400 proceeds to block 416.

In block 416, the system determines whether code optimization of the design is needed. In response to determining that optimization is needed, method 400 may begin the process anew subsequent to performing one or more program code optimizations. In response to determining that no optimization is needed, method 400 continues to block 418. In block 418, the system adjusts one or more design constraints and continues with block 412. The process illustrated may perform an automated and iterative methodology to achieve timing closure of the design as implemented with the established PBlock. It should be appreciated that PBlock processing may also be an iterative methodology where different constraints of the PBlock are updated to meet timing.

In block 420, the system generates a locked version of the design that excludes the DFX module. The locked version of the design also may be saved as a design checkpoint file. The locked version of the design generated in block 420 specifies the placed and routed design for those portions of the design outside of the PBlock (e.g., the DFX region). For example, the locked version of the design specifies a placed and routed version of platform 208 (if included) and inference engine 214 (e.g., with the data transformer of the DFX module having been removed therefrom).

In block 422, the system generates the abstract shell. In one or more example implementations, the abstract shell may be specified as a design checkpoint file. A design checkpoint file is a file, or a package file, that specifies the information described herein and that is readable by the system. In general, the abstract shell generated in block 422 is an abstract representation of any circuitry of the static region of programmable IC 160 that interfaces with, or connects to, circuitry included in a DFX module of a design (e.g., where the DFX module refers to a program code module of a design and the DFX region refers to a physical region on the target IC). The abstract shell does not specify any logic or circuitry of the static region except for logic and/or circuitry that exists at a boundary of the user's circuit design (e.g., DFX module) such as module ports that connect to circuitry in the static region.

The abstract shell may be used by the system to implement a custom circuit design within a DFX module and connect or link the custom circuit design to the circuitry in the static region of the programmable IC. The abstract shell specifies the placement and pins to which pins of the custom circuit design must connect when placed and routed. The abstract shell is significantly smaller in size than the remainder of the design (e.g., the portions of the design implemented in static circuitry). By using the abstract shell instead of the entire design, the EDA tools are capable of implementing the custom circuit design in the DFX module (e.g., the data transformer) in significantly less time and with significantly fewer computational resources than would otherwise be the case.

The system is capable of creating the abstract shell by extracting the module (e.g., the DFX module) from the design once implemented by placement and routing. The system also removes any data specifying circuitry and/or logic with the exception of the boundary ports of the DFX module that connect to the static region. The resulting file may be saved as an abstract shell.

Figure 5:
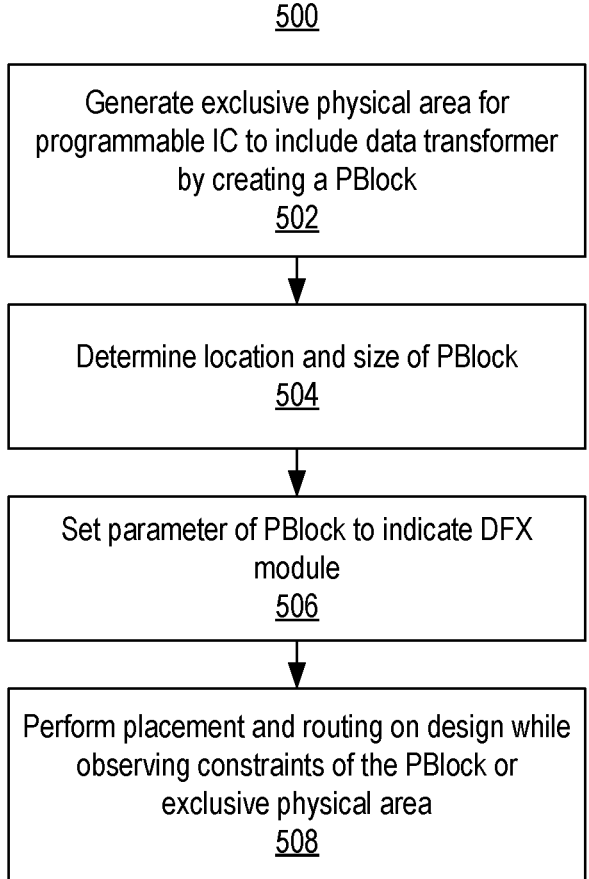
FIG. 5 illustrates an example method of PBlock processing.

FIG. 5 illustrates an example method 500 of PBlock processing. Method 500 illustrates a more detailed example of the processing described in connection with block 410 of FIG. 4.

In block 502, the system generates a defined physical area on programmable IC 160. The defined physical area includes only data transformer 212 (e.g., a first data transformer). In the examples described herein, the first data transformer may be an example or sample design for a data transformer that is used to approximate the size of the exclusive physical area that is being generated. In the example of FIG. 5, the system generates the defined physical area as an exclusive physical area on programmable IC 160 by creating a PBlock (e.g., a data structure).

In block 504, the system determines the location and size of the PBlock. The system may also determine the dimensions of the PBlock. For example, the system is capable of sizing the exclusive physical area based on resource usage of the first data transformer. That is, the system sets the size parameters of the PBlock based on resource usage of the first data transformer. For example, the system determines the number of look-up tables, flip-flops, macros (e.g., RAM, digital signal processing blocks), etc., used to implement the first data transformer as the resource utilization. The resource utilization, by defining particular cells or circuit tiles of programmable IC 160 may be used to determine the size of the first data transformer. The system may specify the size and/or shape of the transformer by setting a size parameter and/or by setting dimension parameters of the PBlock such as length and/or width based on the determined resource utilization of the first data transformer. Further description of sizing of the PBlock, as performed by the system, is described hereinbelow.

The system is capable of locating the exclusive physical area on programmable IC 160 to a location that is non-obstructing of buses that connect inference engine 214 with a memory such as memory 210. Again, the system sets the location of the exclusive physical area by setting location parameters of the PBlock. The system is capable also of locating the exclusive physical area on programmable IC 160 so that the exclusive physical area is non-obstructing of any buses linking a plurality of modules of inference engine 214. The system is capable of also locating the exclusive physical area on programmable IC 160 so that signals between the PBlock and the memory meet predetermined timing constraints.

In block 506, the system sets a parameter of the PBlock to indicate that the PBlock is a DFX module. In the example of FIGS. 2A and 2B, in setting the parameter of the PBlock to indicate a nested DFX module, other portions of the original DFX module that included AI application 202 are rendered or considered static by the system. That is, the inference engine implementation becomes static. In the example of FIG. 2C, any portions external to the DFX module become static. Accordingly, the PBlock includes the data transformer (e.g., a sample data transformer for AI application 202) while the portion of the design specifying inference engine 214 is rendered or changed to "static." Thus, inference engine 214 and platform 208, if included, are considered static or unchanging portions of the design.

In block 508, the system performs placement and routing on the design (e.g., the design with platform 208 if included and inference engine 214 considered static and the PBlock containing the first data transformer being a DFX module having strict location and sizing constraints). In performing placement and routing, the system observes the constraints of the exclusive physical area (e.g., any location and/or size constraints for the PBlock).

Figure 6:
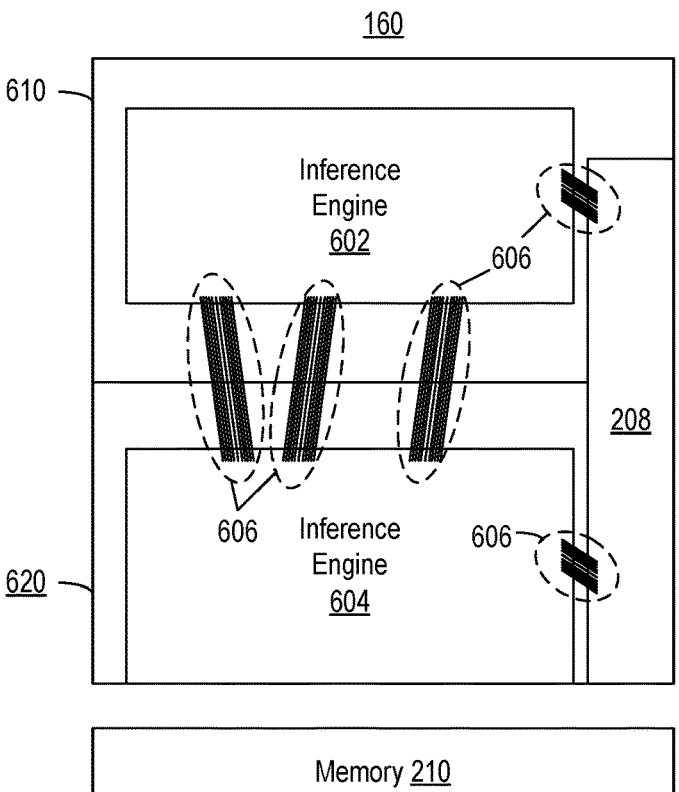
FIG. 6 illustrates an example floorplan of a programmable IC having an AI application implemented therein.

FIG. 6 illustrates an example floorplan of programmable IC 160 having an AI application implemented therein. As noted, memory 210 may or may not be included as part of programmable IC 160. In the example, the AI application includes two inference engines 602 and 604. In the example, programmable IC 160 includes two super logic regions (SLRs). Each SLR may be implemented as a separate die where the two dies are communicatively linked within the package (e.g., by an interposer or other technology).

In the example, inference engine 602 is implemented in SLR 610 and inference engine 604 is implemented in SLR 610. In the example, the AI application also includes a data transformer that is interspersed with the respective inference engines 602, 604 throughout the blocks labeled inference engine 602, 604. Further, those portions of the AI application that allow each inference engine 602, 604 to communicate with memory 210 by way of platform 208 may be distributed throughout the inference engine blocks 602, 604 shown. In each SLR, additional unused programmable circuitry is available. Communication buses 606 that communicatively link inference engine 602 with inference engine 604 and that link each respective inference engine 602, 604 with platform 208 are illustrated. In the example, platform 208 is implemented across both SLRs 610, 620.

In cases where platform 208 is not included, such components may communicate directly among themselves and/or with other components such as memory 210. Further, in other implementations when platform 208 is included, components of the AI application may communicate directly with memory 210 and/or among themselves and/or with or via platform 208.

Figure 7:
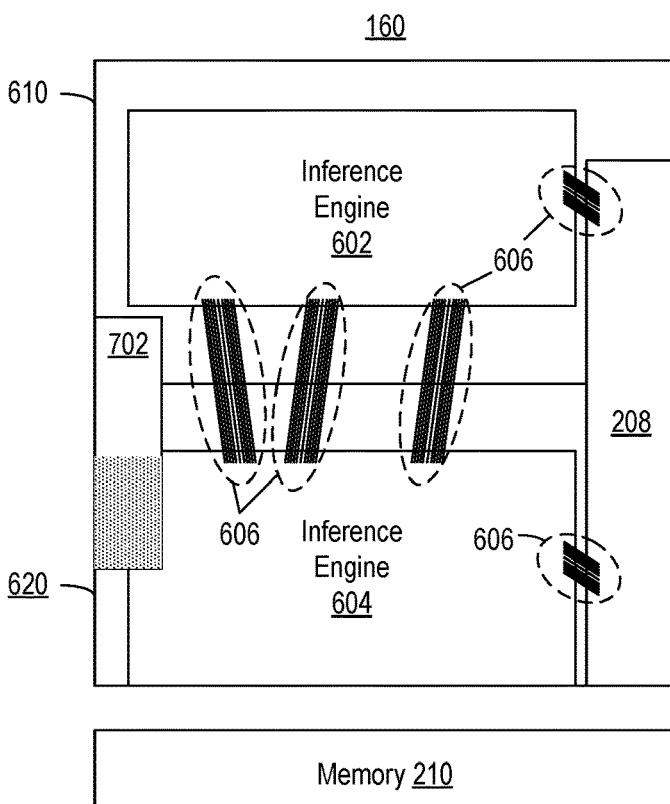
FIG. 7 illustrates an example floorplan of a programmable IC with a location and size of a PBlock having been determined.

FIG. 7 illustrates an example floorplan of programmable IC 160 with a location and size of PBlock 702 having been determined. PBlock 702 is superimposed over the existing floorplan of the design for programmable IC 160 for purposes of illustration. As may be observed by the shading of PBlock 702, approximately 50% of the area of PBlock 702 is utilized with the first (e.g., sample) data transformer design.

In one or more examples, in determining the size of PBlock 702, the system may determine the total number of resources utilized by the sample data transformer to calculate an initial size and then increase the size to add an additional margin of unused programmable circuitry to PBlock 702. This allows different data transformer designs to be utilized or swapped into programmable IC 160 over time in the exclusive physical area without having to re-implement the entire design (referring to the AI application and the platform).

In terms of location, the system is capable of determining or marking the locations of wide buses and components (e.g., memory) to which the data transformer (not shown) and/or the inference engines 602, 604 are connected (e.g., buses 606). For example, the system determines the particular cells or logic blocks through which these buses traverse. The system is also capable of determining or marking the locations of any other large buses that may span across a large area of programmable IC 160. For example, a bus having more than a threshold number of signals or that spans more than a threshold distance may be marked with the system determining each of the cells and/or logic blocks through which such buses traverse.

In determining the location of PBlock 702, the system may place or locate PBlock 702 at least a minimum distance from each of such marked locations (e.g., buses). The system may resize (e.g., change the length, width, or both) PBlock 702 to ensure that the boundaries of PBlock 702 are a minimum distance from the aforementioned buses to be avoided. In one or more examples, the overall size (e.g., area) of PBlock 702 may be kept constant while length and/or width of PBlock 702 is changed. In another example, the system may change the size (area) of PBlock 702. The system also places or locates PBLock 702 close enough to memory 210 so that there are no timing failures for signal paths between the data transformer and memory 210. In the example, the system has located PBlock 702 on an opposite edge of programmable IC 160 from platform 208.

Figure 8:
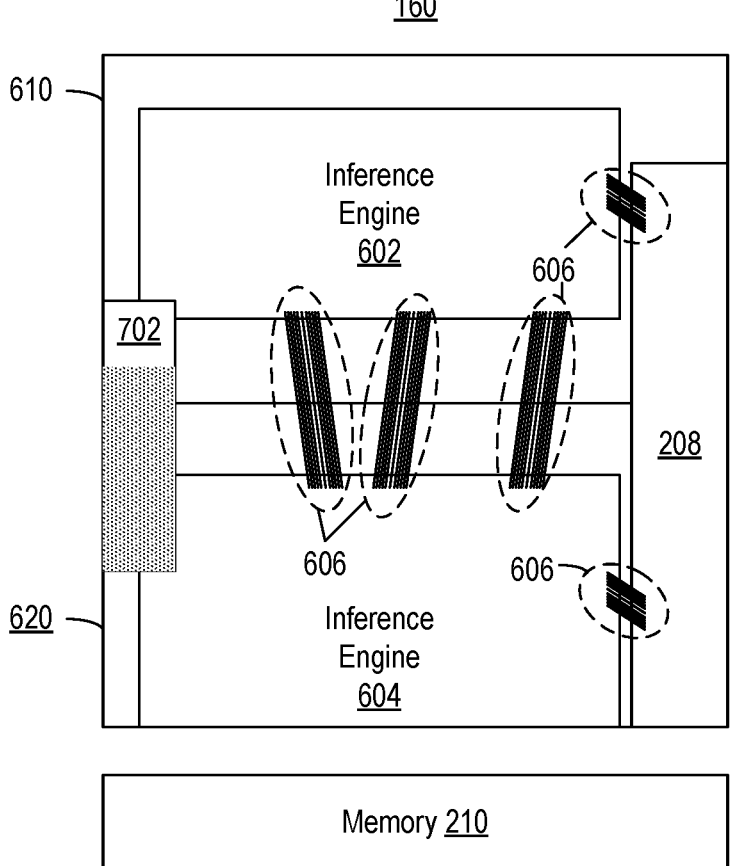
FIG. 8 illustrates an example floorplan of a programmable IC with the PBlock fully defined.

FIG. 8 illustrates an example floorplan of programmable IC 160 after reimplementing the design with PBlock 702 fully defined. FIG. 8 illustrates the state of the design subsequent to block 508 of FIG. 5. In the example, the system has performed placement and routing while observing any constraints (e.g., location and/or size and/or dimensions) associated with PBlock 702, which has been designated as a DFX module. As illustrated, inference engine 602 has expanded in both SLRs 610 and 620 due to the exclusivity of PBlock 702. That is, inference engine 602 is no longer permitted to occupy any portion of the exclusive physical area of programmable IC 160 defined by PBlock 702.

Though not illustrated in the example of FIG. 8, it should be appreciated that PBlock 702 will also have connections to other components such as inference engines 602, 604, platform 218 (when included), and/or memory 210. Such connections are fixed as static circuitry with closed timing. Accordingly, as other data transformers are implemented in PBlock 702, such circuitry need not be re-implemented.

FIG. 9 illustrates an example method 900 of replacing the data transformer of the design with a different data transformer. In one or more example implementations, method 900 may be performed to implement block 310 of FIG. 3.

In block 902, the system receives a design for a second data transformer (e.g., a different data transformer) may be received. As noted, the initial or first data transformer utilized to generate the design checkpoint file specifying the platform and the inference engine may have been a sample data transformer.

In block 904, the system configures the design for the second data transformer. In block 906, the system links the design for the second data transformer with the abstract shell. In block 908, the system synthesizes only the abstract shell (e.g., with the design for the second data transformer linked therewith or included therein).

In block 910, the system implements the abstract shell as linked. For example, the system performs placement and routing on the abstract shell as linked to generate a placed and routed version of the second data transformer. The placement and routing performed using the abstract shell ensures that the second data transformer is implemented within the exclusive physical area defined by the PBlock and connects to the appropriate pins and/or ports of the static circuitry of the design checkpoint file.

In block 912, the system extracts the implemented design from the abstract shell. In block 914, the system attaches the extracted design to the locked version of the design that specifies the inference engine and the platform. In block 916, the system generates configuration data (e.g., a binary file such as a configuration bitstream) that may be loaded into programmable IC 160 to implement the updated design therein. The updated design includes the platform, the inference engine, and the newly added or replaced data transformer (e.g., the second data transformer). The resulting configuration data may be loaded into programmable IC 160 and run.

As noted, in one or more other example implementations, a configuration bitstream may be generated from the extracted design for the second transformer without attaching the design to the locked version of the design as described in connection with blocks 914, 916. The configuration bitstream for the second transformer (e.g., a partial configuration bitstream) may be directly programmed into programmable IC 160 without generating a new full configuration bitstream for programmable IC 160.

The terminology used herein is for the purpose of describing particular embodiments only and is not intended to be limiting. Notwithstanding, several definitions that apply throughout this document are expressly defined as follows.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" May mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention.

As defined herein, the term "computer-readable storage medium" means a storage medium that contains or stores program instructions for use by or in connection with an instruction execution system, apparatus, or device. As defined herein, a "computer-readable storage medium" is not a transitory, propagating signal per se. The various forms of memory, as described herein, are examples of computer-readable storage media. A non-exhaustive list of examples of computer-readable storage media include an electronic storage device, a magnetic storage device, an optical storage device, an electromagnetic storage device, a semiconductor storage device, or any suitable combination of the foregoing. A non-exhaustive list of more specific examples of a computer-readable storage medium may include: a portable computer diskette, a hard disk, a RAM, a read-only memory (ROM), an erasable programmable read-only memory (EPROM or Flash memory), an electronically erasable programmable read-only memory (EEPROM), a static random-access memory (SRAM), a portable compact disc read-only memory (CD-ROM), a digital versatile disk (DVD), a memory stick, a floppy disk, or the like.

As defined herein, "data processing system" means one or more hardware systems configured to process data, each hardware system including at least one hardware processor programmed to initiate operations and memory.

As defined herein, the term "if" means "when" or "upon" or "in response to" or "responsive to," depending upon the context. Thus, the phrase "if it is determined" or "if [a stated condition or event] is detected" May be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "individual" and "user" each refer to a human being.

As defined herein, the term "processor" means at least one hardware circuit. The hardware circuit may be configured to carry out instructions contained in program code. The hardware circuit may be an integrated circuit. Examples of a hardware processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, and a controller.

As defined herein, the terms "one embodiment," "an embodiment," "in one or more embodiments," "in particular embodiments," or similar language mean that a particular feature, structure, or characteristic described in connection with the embodiment is included in at least one embodiment described within this disclosure. Thus, appearances of the aforementioned phrases and/or similar language throughout this disclosure may, but do not necessarily, all refer to the same embodiment.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc., may be used herein to describe various elements. These elements should not be limited by these terms, as these terms are only used to distinguish one element from another unless stated otherwise or the context clearly indicates otherwise.

A computer program product may include a computer-readable storage medium (or media) having computer-readable program instructions thereon for causing a processor to carry out aspects of the inventive arrangements described herein. Within this disclosure, the term "program code" is used interchangeably with the term "program instructions." Computer-readable program instructions described herein may be downloaded to respective computing/processing devices from a computer-readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object-oriented programming language and/or procedural programming languages. Computer-readable program instructions may include state-setting data. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer-readable program instructions by utilizing state information of the computer-readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer-readable program instructions, e.g., program code.

These computer-readable program instructions may be provided to a processor of a computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the operations specified in the flowchart and/or block diagram block or blocks.

The computer-readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:

for a design for a programmable integrated circuit that is synthesized and includes an inference engine and a data transformer, designating a portion of the design including the data transformer as a dynamic function exchange (DFX) module, wherein the inference engine is excluded from the DFX module;

implementing, by placing and routing, the design such that the DFX module is confined to a defined physical area of the programmable integrated circuit;

generating an abstract shell for the design specifying boundary connections of the DFX module as placed and routed;

generating a locked version of the design as placed and routed with the DFX module removed; and implementing a different data transformer as a further DFX module for the design using the abstract shell.

2. The method of claim 1, further comprising:

attaching the different data transformer, as implemented, to the locked version of the design.

3. The method of claim 1, wherein the DFX module is a nested DFX module.

4. The method of claim 1, wherein the implementing the different data transformer includes:

performing placement and routing of the different data transformer to fit within the defined physical area.

5. The method of claim 1, wherein the defined physical area is defined by creating a data structure associated with the data transformer, the data structure specifying a size and a location of the defined physical area on the programmable integrated circuit.

6. The method of claim 5, further comprising:

setting a size parameter of the data structure based on resource usage of the data transformer.

7. The method of claim 5, further comprising:

setting a location parameter of the data structure to specify a location that is non-obstructing of buses of the design.

8. The method of claim 7, wherein the buses include buses linking the inference engine to other components of the programmable integrated circuit.

9. The method of claim 7, wherein the location specified by the location parameter is determined so that signals between the defined physical area and a memory meet predetermined timing constraints.

10. A system, comprising:

one or more hardware processors configured to initiate operations including:

for a design for a programmable integrated circuit that is synthesized and includes an inference engine and a data transformer, designating a portion of the design including the data transformer as a dynamic function exchange (DFX) module, wherein the inference engine is excluded from the DFX module;

implementing, by placing and routing, the design such that the DFX module is confined to a defined physical area of the programmable integrated circuit;

generating an abstract shell for the design specifying boundary connections of the DFX module as placed and routed;

generating a locked version of the design as placed and routed with the DFX module removed; and implementing a different data transformer as a further DFX module for the design using the abstract shell.

11. The system of claim 10, wherein the one or more hardware processors are configured to initiate operations comprising:

attaching the different data transformer, as implemented, to the locked version of the design.

12. The system of claim 10, wherein the DFX module is a nested DFX module.

13. The system of claim 10, wherein the implementing the different data transformer includes:

performing placement and routing of the different data transformer to fit within the defined physical area.

14. The system of claim 10, wherein the defined physical area is defined by creating a data structure associated with the data transformer, the data structure specifying a size and a location of the defined physical area on the programmable integrated circuit.

15. The system of claim 14, wherein the one or more hardware processors are configured to initiate operations comprising:

setting a size parameter of the data structure based on resource usage of the data transformer.

16. The system of claim 14, wherein the one or more hardware processors are configured to initiate operations comprising:

setting a location parameter of the data structure to specify a location that is non-obstructing of buses of the design.

17. The system of claim 16, wherein the buses include buses linking the inference engine to other components of the programmable integrated circuit.

18. The system of claim 16, wherein the location specified by the location parameter is determined so that signals between the defined physical area and a memory meet predetermined timing constraints.

19. A computer program product comprising one or more computer readable storage mediums having program instructions embodied therewith, the program instructions executable by computer hardware to cause the computer hardware to initiate executable operations comprising:

for a design for a programmable integrated circuit that is synthesized and includes an inference engine and a data transformer, designating a portion of the design including the data transformer as a dynamic function exchange (DFX) module, wherein the inference engine is excluded from the DFX module;

implementing, by placing and routing, the design such that the DFX module is confined to a defined physical area of the programmable integrated circuit;

generating an abstract shell for the design specifying boundary connections of the DFX module as placed and routed;

generating a locked version of the design as placed and routed with the DFX module removed; and implementing a different data transformer as a further DFX module for the design using the abstract shell.

20. The computer program product of claim 19, wherein the DFX module is a nested DFX module.

* * * * *